(12) United States Patent
Hasegawa et al.

(10) Patent No.: US 8,243,445 B2
(45) Date of Patent: Aug. 14, 2012

(54) ELECTRONIC APPARATUS

(75) Inventors: Hideaki Hasegawa, Tokyo (JP); Keiichi Aoki, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 82 days.

(21) Appl. No.: 12/750,737

(22) Filed: Mar. 31, 2010

(65) Prior Publication Data

US 2010/0254085 A1 Oct. 7, 2010

(30) Foreign Application Priority Data

Apr. 2, 2009 (JP) ................................. 2009-090571

(51) Int. Cl.
*H05K 7/20* (2006.01)
(52) U.S. Cl. ........ 361/690; 361/692; 361/694; 361/695; 361/719; 174/16.1
(58) Field of Classification Search .................. None
See application file for complete search history.

(56) References Cited

U.S. PATENT DOCUMENTS

| | | | | |
|---|---|---|---|---|
| 6,058,009 | A * | 5/2000 | Hood et al. ............... | 361/679.47 |
| 6,654,242 | B2 * | 11/2003 | Ogawa ..................... | 361/679.48 |
| 6,980,435 | B2 * | 12/2005 | Shum et al. .................. | 361/695 |
| 7,139,170 | B2 * | 11/2006 | Chikusa et al. ............... | 361/695 |
| 7,405,930 | B2 * | 7/2008 | Hongo et al. ............ | 361/679.48 |
| 7,843,685 | B2 * | 11/2010 | Beauchamp et al. .... | 361/679.49 |

FOREIGN PATENT DOCUMENTS

| | | |
|---|---|---|
| CN | 1389770 | 1/2003 |
| JP | 200877436 A | 4/2008 |

OTHER PUBLICATIONS

Chinese Office Action dated Dec. 5, 2011, from corresponding Chinese Application No. 201010155492.3.

* cited by examiner

*Primary Examiner* — Boris Chervinsky
(74) *Attorney, Agent, or Firm* — Katten Muchin Rosenman LLP

(57) ABSTRACT

Provided is an electronic apparatus capable of preventing an unnecessary space from being made inside the housing, and of improving ventilation efficiency of the air flowing along the power circuit. An electronic apparatus includes: a power circuit; a power circuit case (4) housing the power circuit; and a housing (2) for housing the electronic apparatus and the power circuit case (4). The power circuit case (4) includes a rear wall portion (43) having an air outlet (43*a*) formed therein, and the housing (2) having an opening (2*a*) formed therein, a shape of the opening corresponding to the rear wall portion (43) of the power circuit case (4). The power circuit case (4) is arranged such that the rear wall portion (43) is exposed through the opening (2*a*).

6 Claims, 12 Drawing Sheets

ELECTRONIC APPARATUS

CROSS-REFERENCE TO RELATED APPLICATION

The present application claims priority from Japanese patent application No. 2009-090571 filed on Apr. 2, 2009, the content of which is hereby incorporated by reference into this application.

BACKGROUND OF THE INVENTION

1. Field of the Invention

The present invention relates to technology for improving ventilation efficiency of an electronic apparatus provided with a power circuit.

2. Description of the Related Art

An electronic apparatus, such as a game device, a personal computer, and an audio-visual equipment, includes a power circuit for converting electric power supplied from outside of the electronic apparatus into electric power for driving each device installed in the electronic apparatus. There is available a conventional electronic apparatus in which the power circuit is covered with a case (for example, JP 2008-77436 A). In the electronic apparatus disclosed in JP 2008-77436 A, air vents are formed in the case of the power circuit, and air flow generated by a cooling fan installed inside the electronic apparatus flows in the case, thereby cooling the power circuit. Further, air vents for taking in or discharging the air are also formed in the housing forming an outer surface of the electronic apparatus.

In a layout in which the air vents formed in the case for the power circuit are spaced away from the air vents of the housing, and in which other devices (for example, an external storage device) installed in the electronic apparatus are arranged between those air vents, ventilation efficiency is reduced. Meanwhile, in a layout in which such devices are not arranged between the air vents of the case for the power circuit and the air vents of the housing, an unnecessary space exists, with the result that the electronic apparatus is increased in size.

With respect to this problem, there may be considered a layout in which the power circuit and the case housing the power circuit are arranged along a wall in which the air vents of the housing are formed, and in which the air vents of the case and the air vents of the housing are arranged facing each other. However, with such a layout, when the air vents of the case of the power circuit do not precisely conform in position and shape to the air vents of the housing, it is difficult to ensure the ventilation efficiency.

SUMMARY OF THE INVENTION

The present invention has been made in view of the above-mentioned problem, and an object of the present invention is therefore to provide an electronic apparatus capable of preventing an unnecessary space from being made inside the housing, and of improving ventilation efficiency of the air flowing along the power circuit.

In order to solve the above-mentioned problem, an electronic apparatus according to the present invention includes: a power circuit; a case housing the power circuit; and a housing forming an outer surface of the electronic apparatus and housing the case. The case includes a wall having an air vent formed therein, through which air flow for cooling the power circuit passes. The housing has an opening formed therein, a shape of the opening corresponding to the wall of the case. Further, the case is arranged such that the wall of the case is exposed through the opening of the housing.

According to the present invention, it is possible to prevent an unnecessary space from being made inside the housing, and to improve ventilation efficiency of the air flowing through the power circuit.

Further, according to one aspect of the present invention, the wall of the case may be fitted in the opening of the housing. According to this aspect, it is possible to ensure strength of the housing by the wall of the case.

Further, according to one aspect of the present invention, the air vent of the case may be formed in an entire region of the wall. According to this aspect, it is possible to further improve the ventilation efficiency.

Further, according to one aspect of the present invention, the air vent of the case may be provided with a louver for screening the inside of the case from the outside thereof. According to this aspect, it is possible to improve the external appearance of the electronic apparatus.

Further, according to one aspect of the present invention, the housing may include a lower housing opening upward and an upper housing opening downward. Still further, the upper housing may be arranged such that a lower edge of the upper housing is laid on an upper edge of the lower housing, at least one of the lower edge of the upper housing and the upper edge of the lower housing may have a recess formed therein, and the opening of the housing may be defined by an edge of the recess, and another one of the lower edge of the upper housing and the upper edge of the lower housing. According to this aspect, it is possible to simplify an assembly operation for the electronic apparatus. In other words, in an assembly operation, the case can be arranged such that the wall of the case for housing the power circuit is placed on the edge of the lower housing, and then the upper housing can be assembled to the lower housing such that the lower edge of the upper housing is laid on the upper edge of the lower housing.

Further, according to one aspect of the present invention, the housing may include a rear wall portion forming a rear surface of the electronic apparatus, and the opening may be formed in the rear wall portion. According to this aspect, it is possible to improve the external appearance of the electronic apparatus.

Further, according to one aspect of the present invention, the power circuit may include a circuit board having a front surface on which an electronic component is mounted, and the case may include an air passage in the front surface side of the circuit board and an air passage in a back surface side of the circuit board. According to this aspect, the air passage is also provided in the back surface side of the circuit board, and hence it is possible to improve the ventilation efficiency. Further, according to this aspect, the air vent may be arranged so that the air flowing through the air passage on the front surface side of the circuit board passes through the air vent. The case may also have a second air vent formed therein, through which the air flowing through the air passage in the back surface side of the circuit board passes. Still further, the second air vent may be located inside the housing, and the housing may have an air vent formed therein and facing the second air vent. With this structure, it is possible to smoothly discharge the air flowing at the back surface side of the circuit board to the outside of the housing.

DETAILED DESCRIPTION OF THE INVENTION

Figure 1:
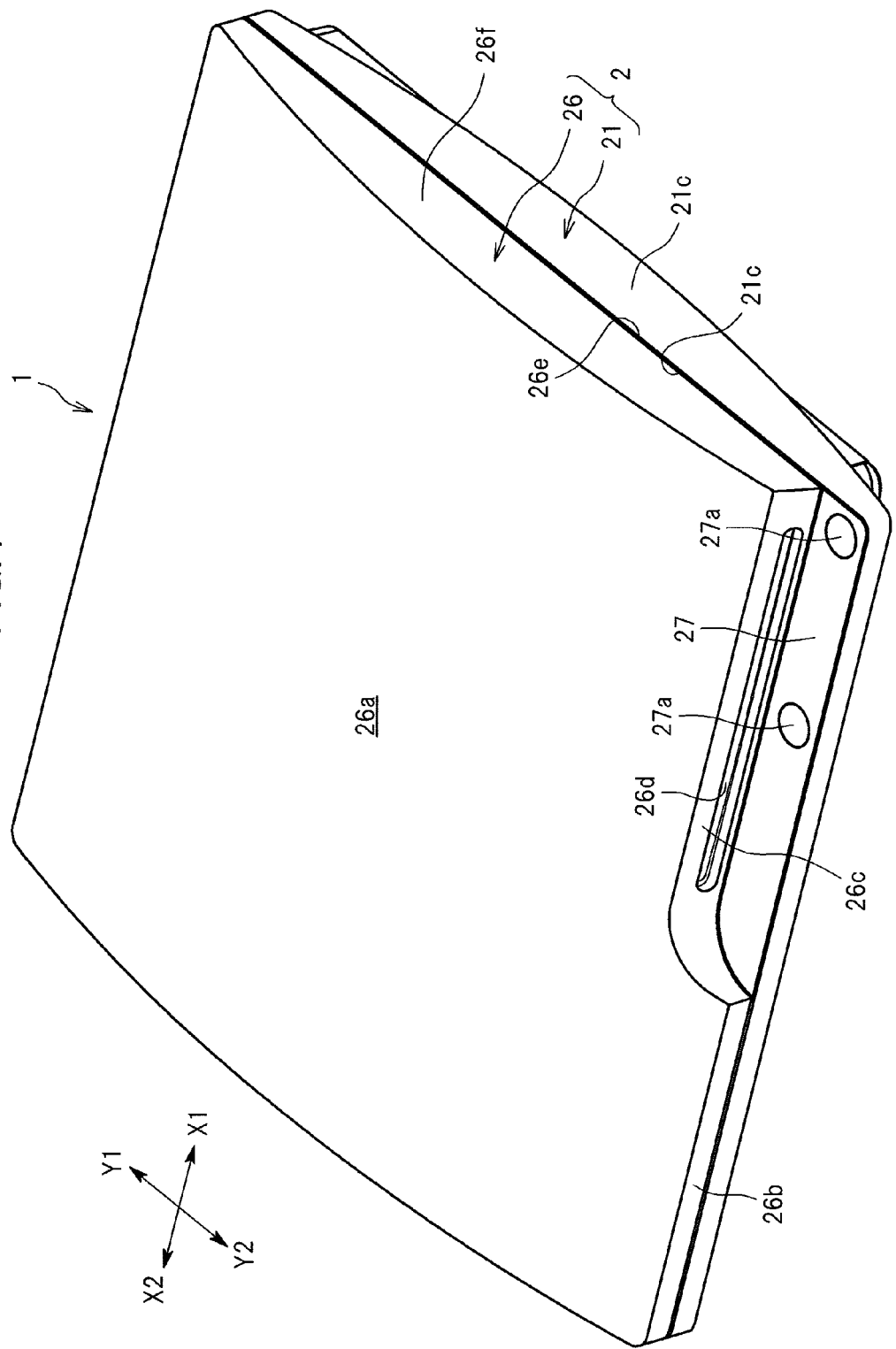
FIG. 1 is a perspective view of an electronic apparatus as an example according to an embodiment of the present invention.
Figure 2:
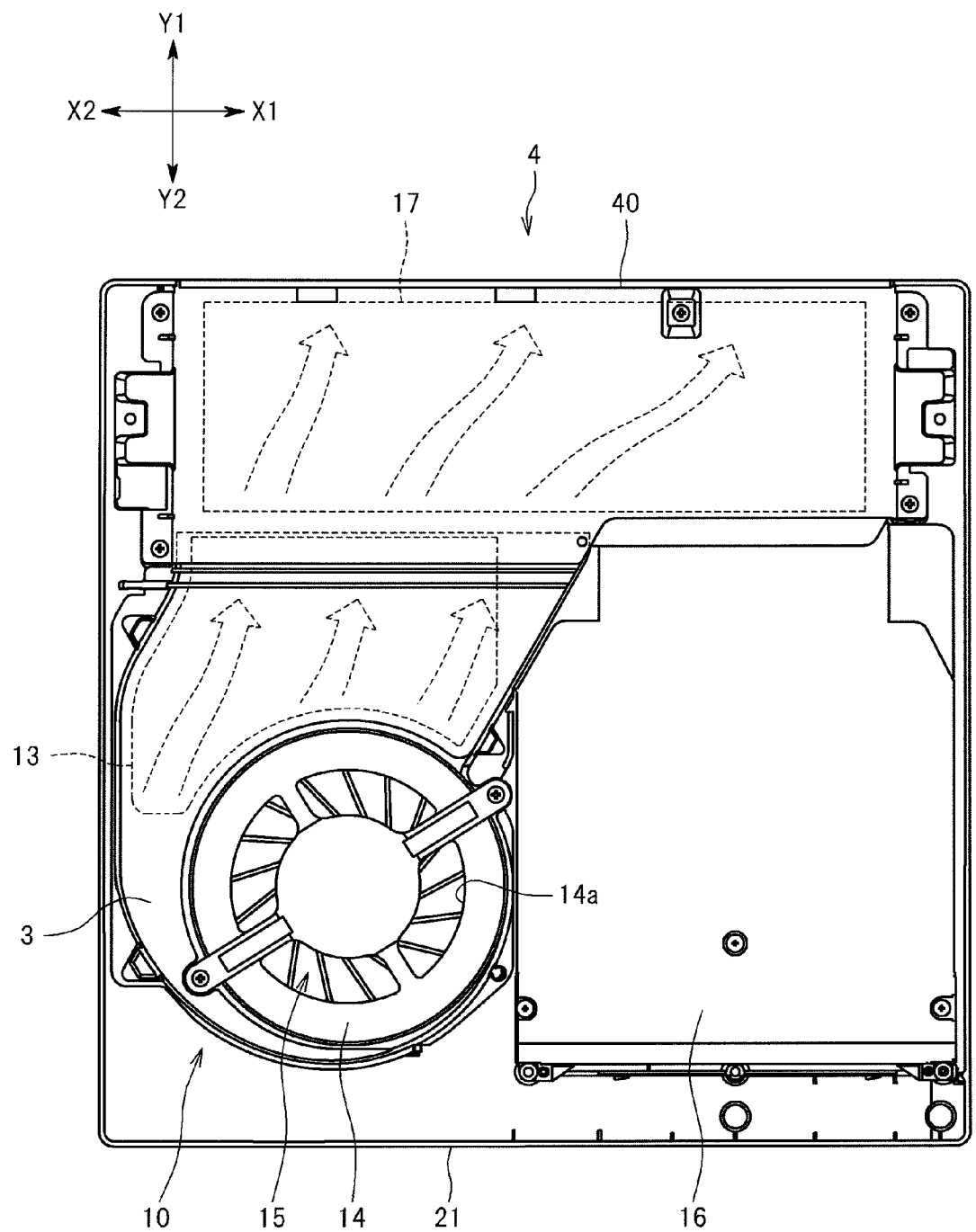
FIG. 2 is a plan view of the electronic apparatus in a state in which an upper housing is detached therefrom.
Figure 3:
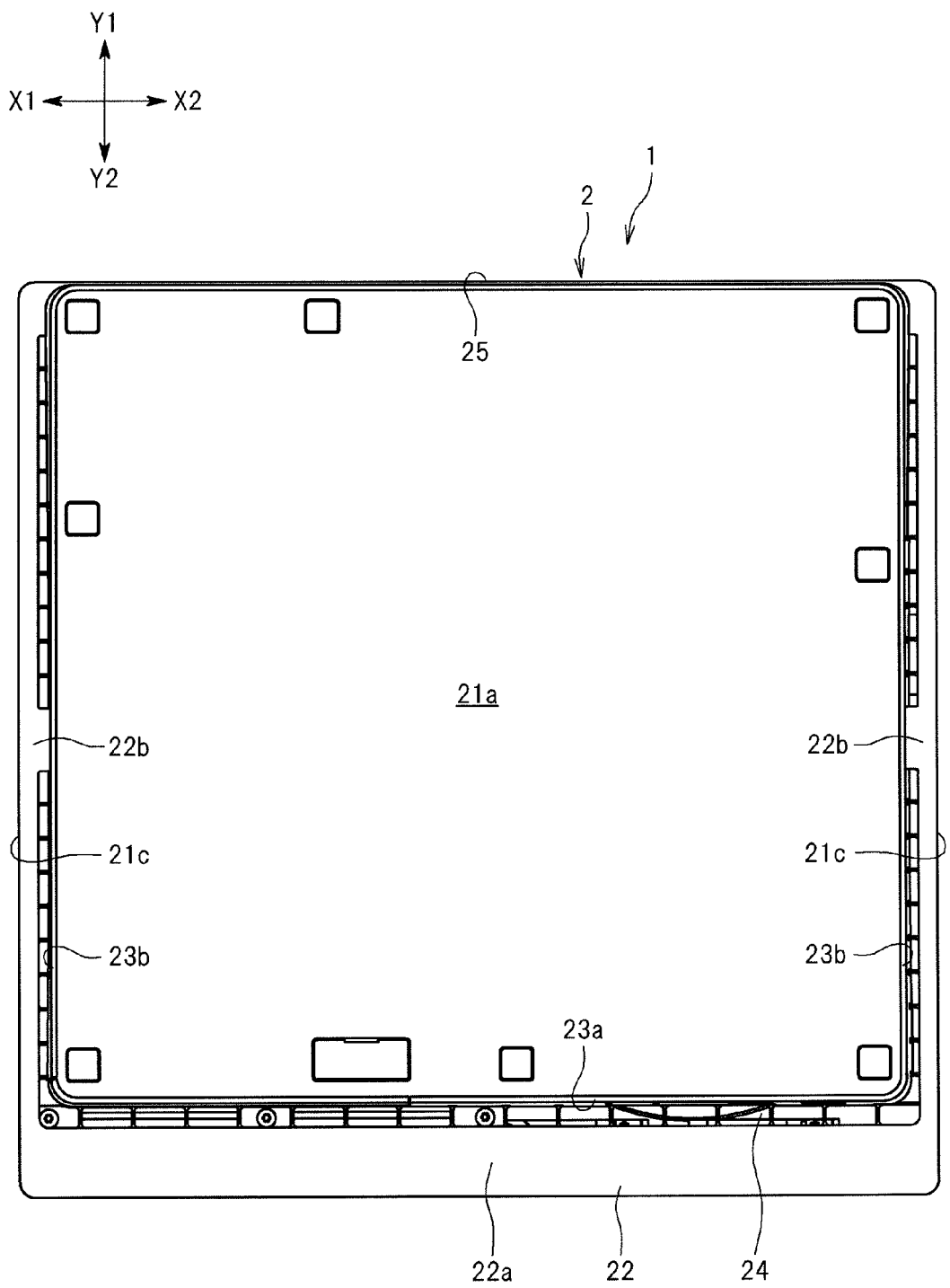
FIG. 3 is a bottom view of the electronic apparatus.
Figure 4:
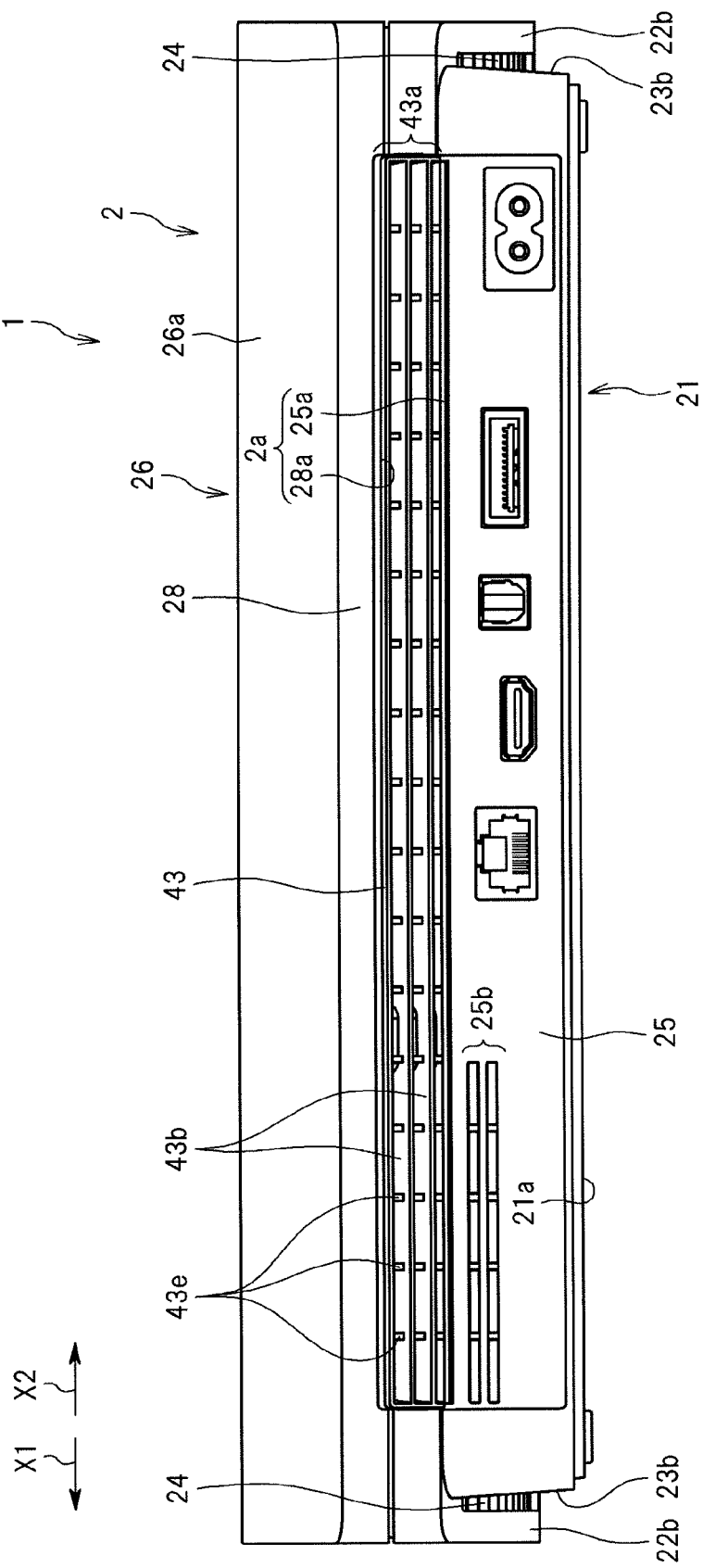
FIG. 4 is a back view of the electronic apparatus.
Figure 5:
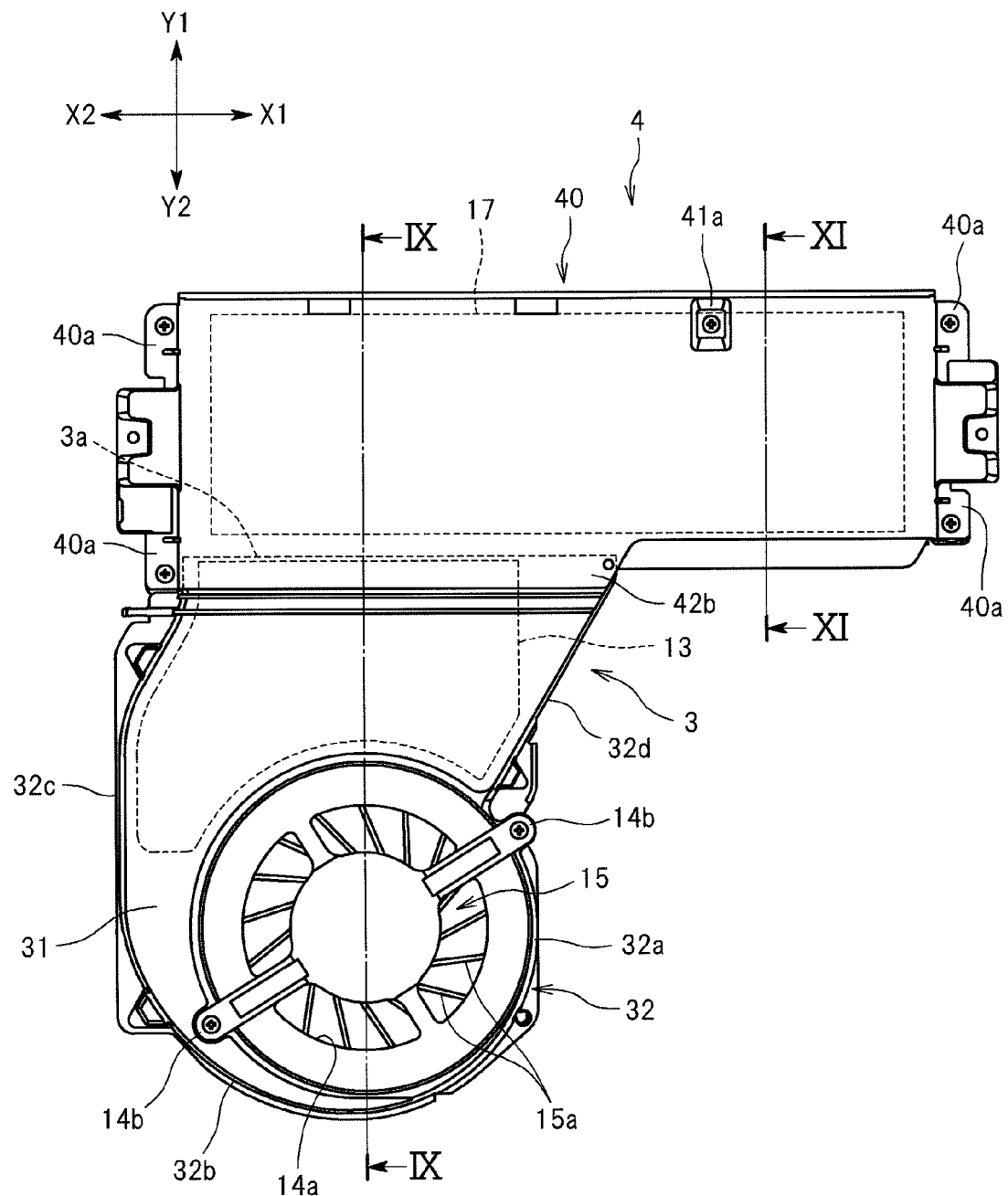
FIG. 5 is a plan view of a cooling unit of the electronic apparatus and a power circuit case housing a power circuit.
Figure 6:
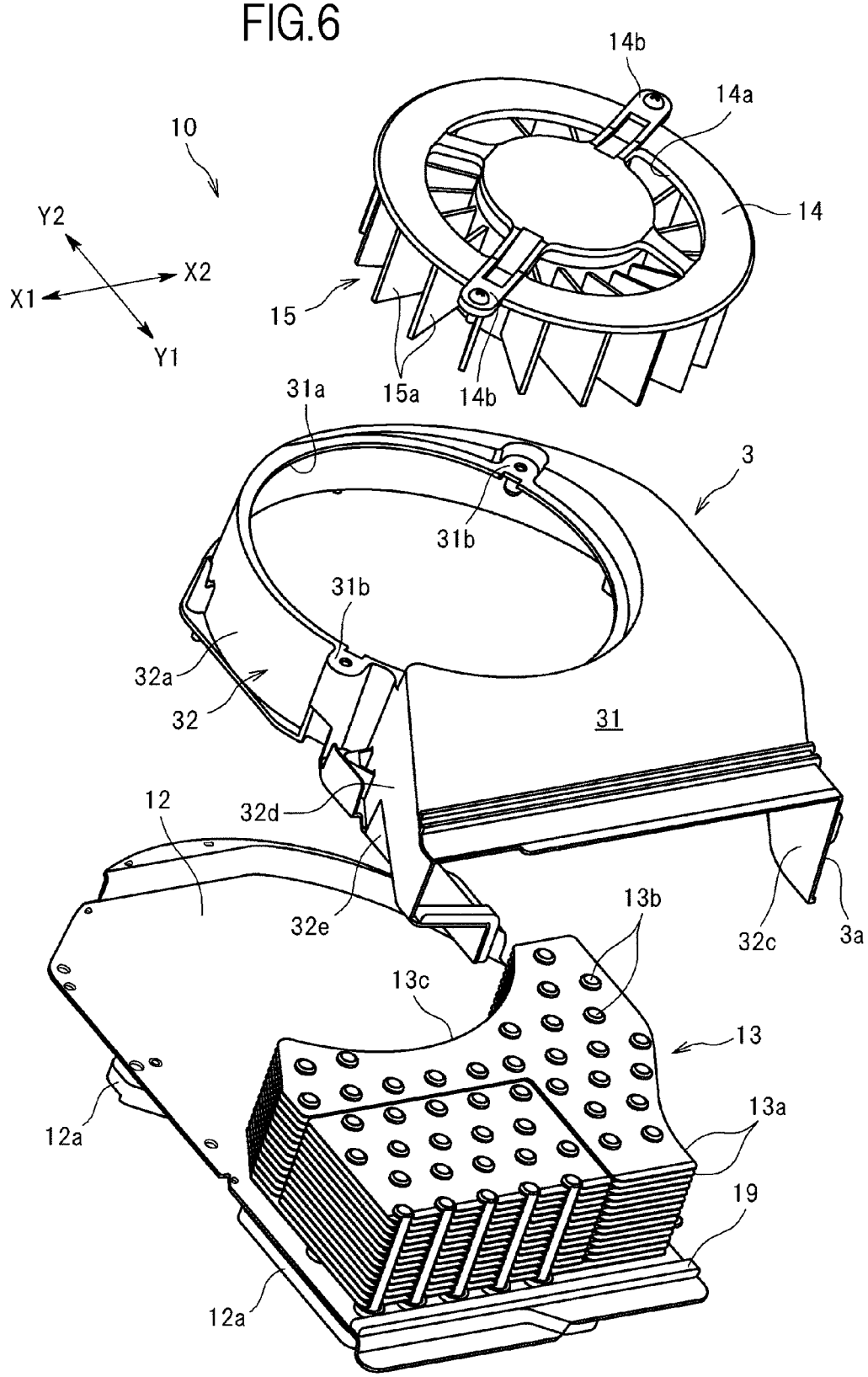
FIG. 6 is an exploded perspective view of the cooling unit.
Figure 7:
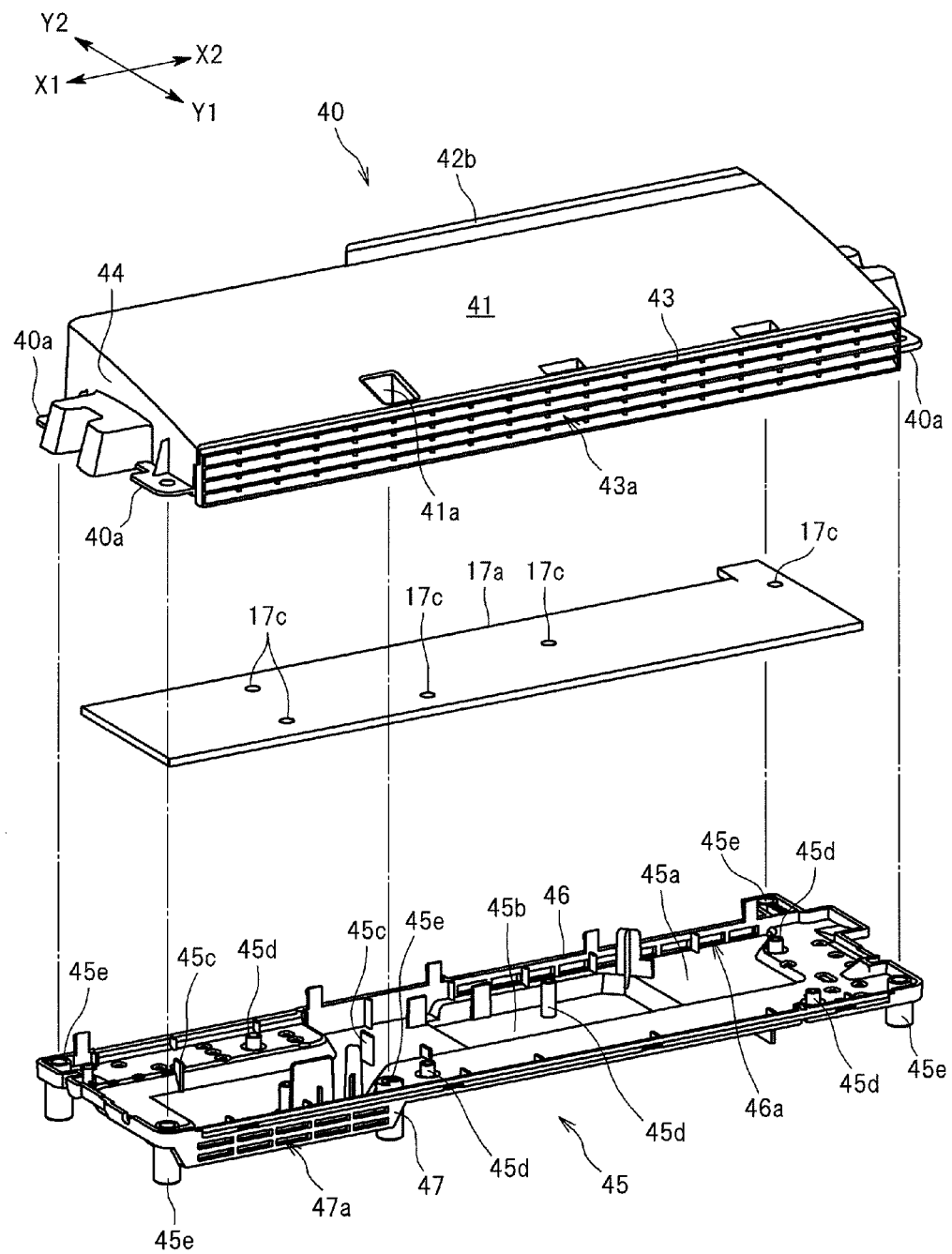
FIG. 7 is an exploded perspective view of the power circuit case.
Figure 8:
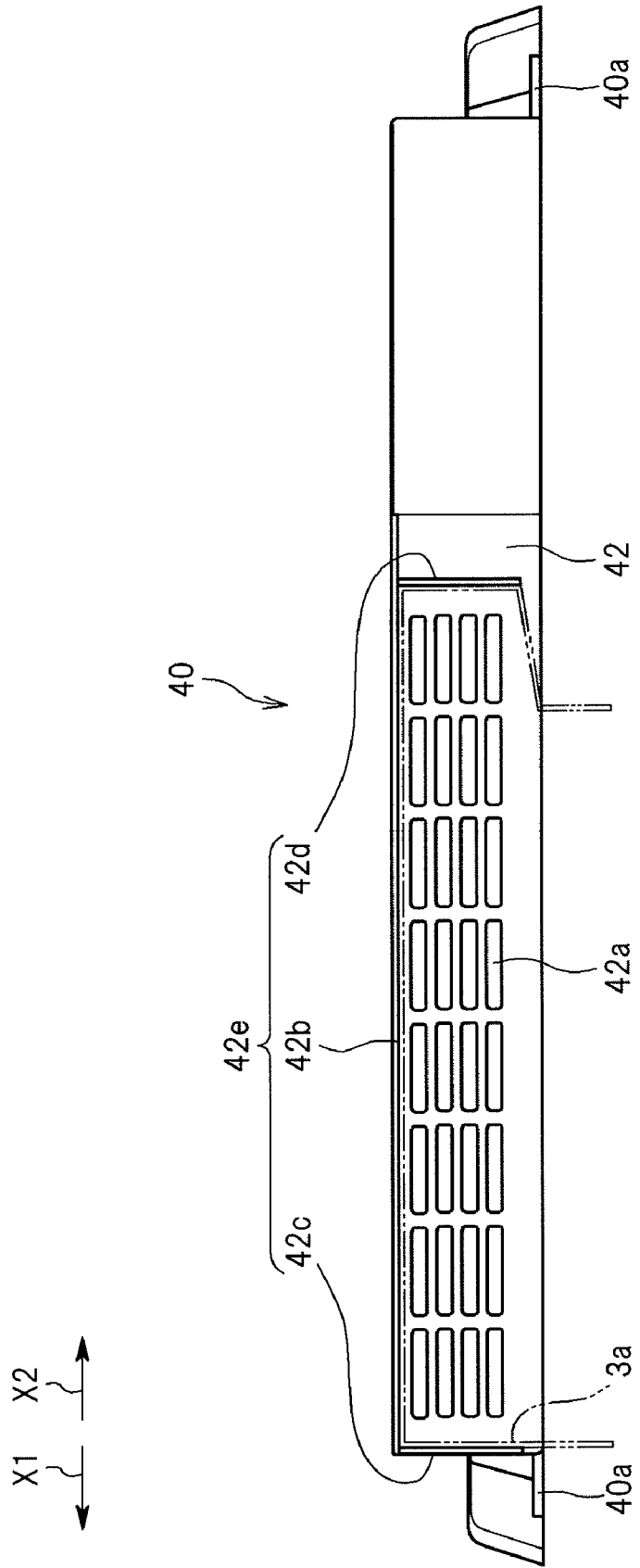
FIG. 8 is a front view of an upper wall member constituting the power circuit case.
Figure 9:
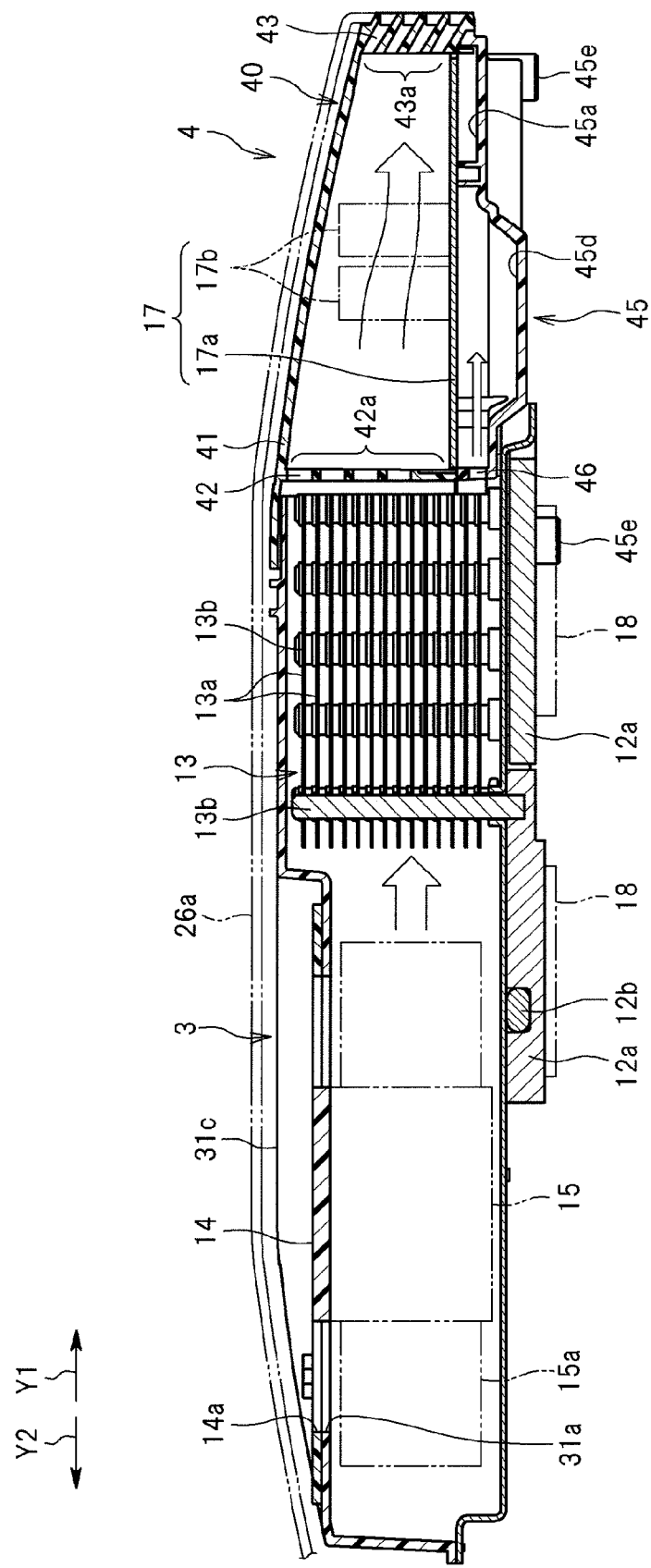
FIG. 9 is a sectional view taken along the line IX-IX of FIG. 5.
Figure 10:
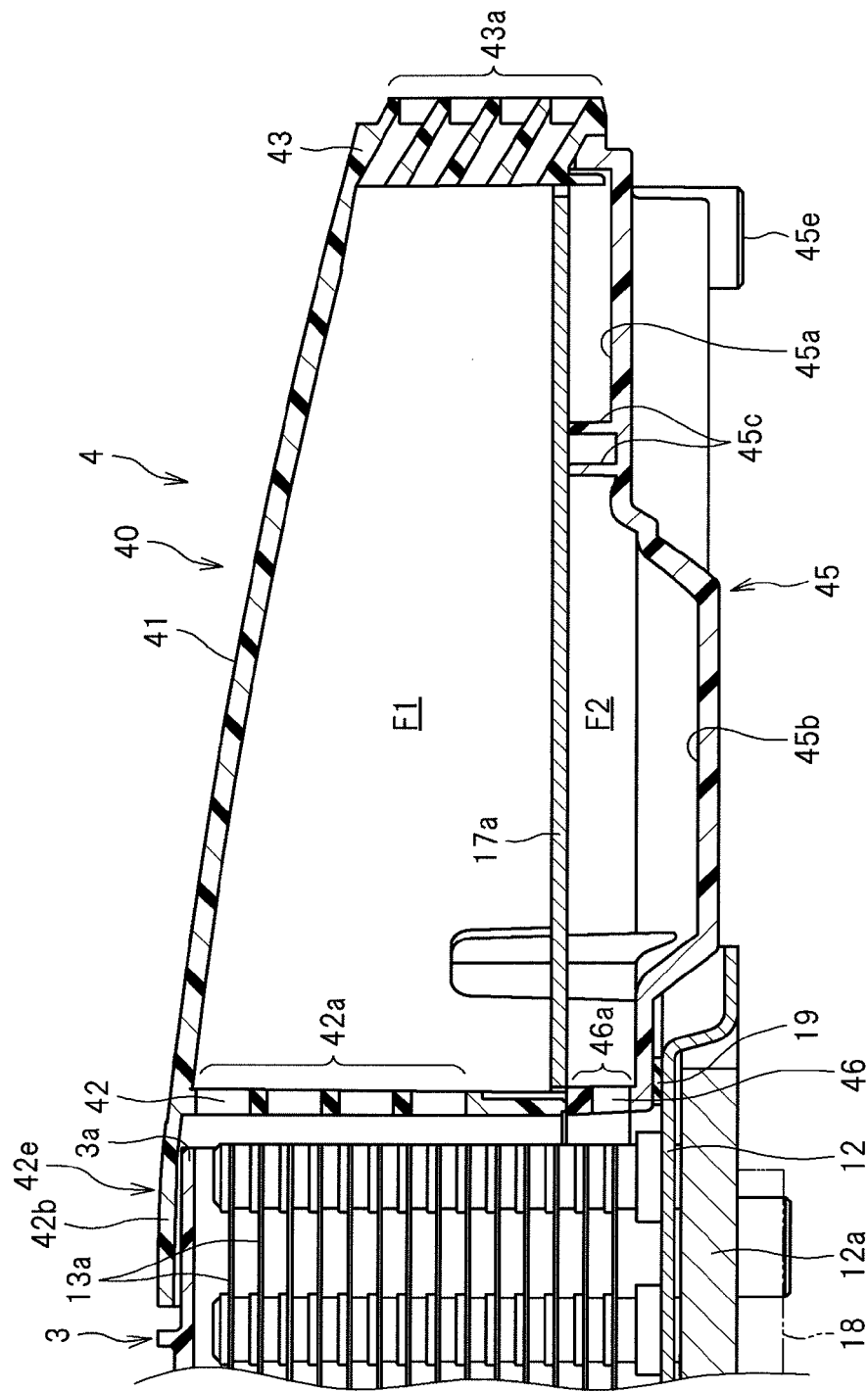
FIG. 10 is an enlarged view of FIG. 9.
Figure 11:
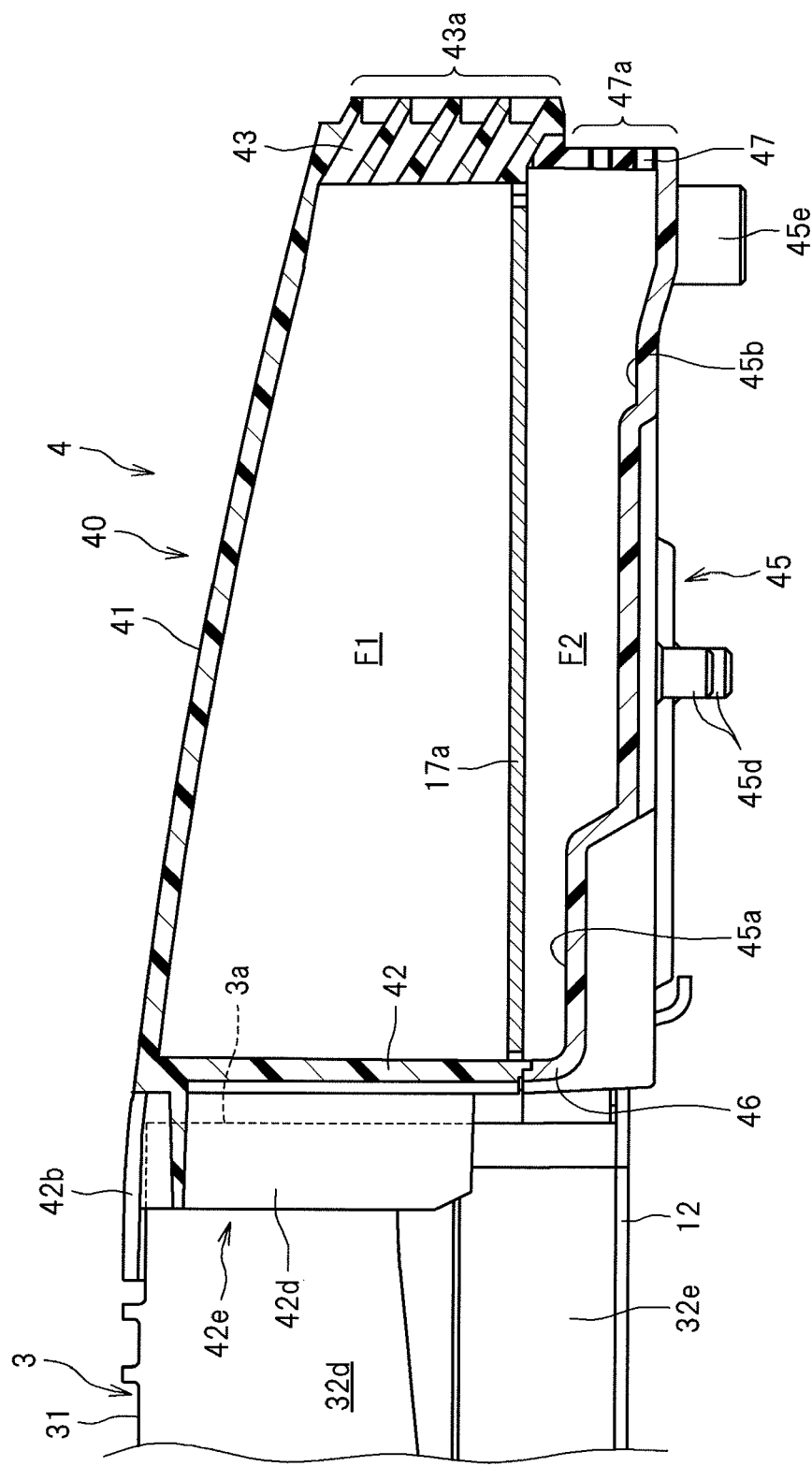
FIG. 11 is a sectional view taken along the line XI-XI of FIG. 5.
Figure 12:
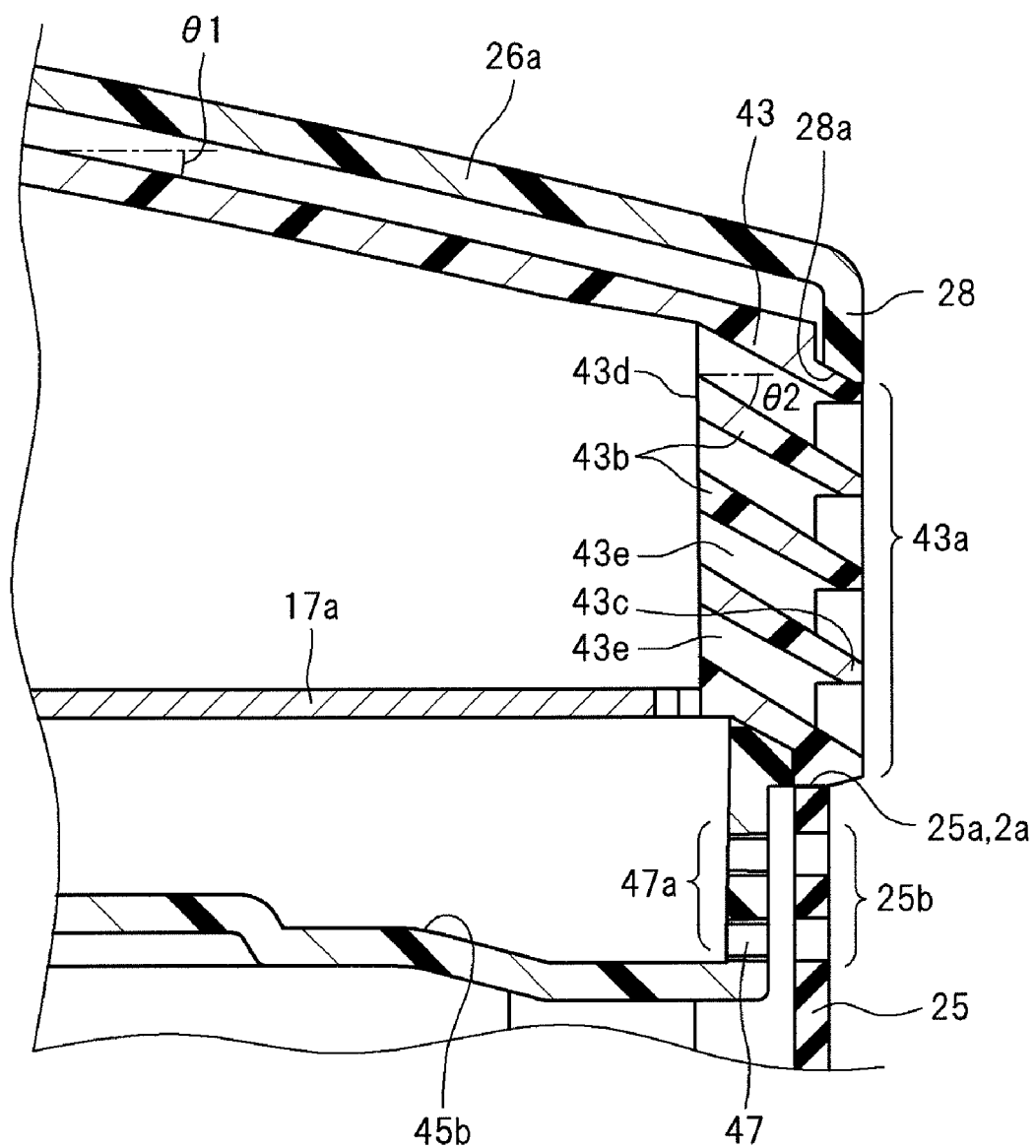
FIG. 12 is an enlarged view of FIG. 11.

An embodiment of the present invention is described below. FIG. 1 is a perspective view of an electronic apparatus 1 as an example according to the embodiment of the present invention. FIG. 2 is a plan view of the electronic apparatus 1 in a state in which an upper housing 26 is detached therefrom. FIG. 3 is a bottom view of the electronic apparatus 1. FIG. 4 is a back view of the electronic apparatus 1. FIG. 5 is a plan view of a cooling unit 10 of the electronic apparatus 1 and a power circuit case 4 housing a power circuit 17. FIG. 6 is an exploded perspective view of the cooling unit 10. FIG. 7 is an exploded perspective view of power circuit case 4. FIG. 8 is a front view of an upper wall member 40 constituting the power circuit case 4. FIG. 9 is a sectional view taken along the line IX-IX of FIG. 5. FIG. 10 is an enlarged view of FIG. 9. FIG. 11 is a sectional view taken along the line XI-XI of FIG. 5. FIG. 12 is an enlarged view of FIG. 11. In this regard, in FIGS. 7, 10, and 11, illustration of electronic components 17b mounted on a front surface side of a circuit board 17a of the power circuit 17 is omitted. In FIG. 9, the electronic components 17b are indicated by chain double-dashed lines.

As illustrated in FIG. 1, the electronic apparatus 1 includes a housing 2 forming an outer surface of the electronic apparatus 1. The housing 2 includes a lower housing 21 opening upward and the upper housing 26 arranged covering the lower housing 21 from above. The upper housing 26 is arranged such that a lower edge 26e thereof is laid on an upper edge 21b of the lower housing 21, to thereby close the lower housing 21 from above.

In this regard, the upper housing 26 has a plate-like upper plate portion 26a arranged facing the lower housing 21 in an up-and-down direction. The upper plate portion 26a is curved such that the central portion of the upper plate portion 26a in a front-rear direction (Y1-Y2 direction) swells upward. Further, the upper housing 26 has side wall portions 26f extending downward from right and left edges of the upper plate portion 26a, respectively. Still further, the upper housing 26 has, in a front portion thereof, a left front-wall portion 26b and a right front-wall portion 26c extending downward from a front edge of the upper plate portion 26a toward the lower housing 21. A game device or audio-visual equipment is exemplified as the electronic apparatus 1, in which a medium insertion slot 26d from which a portable storage medium such as an optical disc is inserted is formed in the right front-wall portion 26c. In addition, a front board 27, provided with buttons 27a for operating the electronic apparatus 1, is arranged in front of the right front-wall portion 26c.

As illustrated in FIG. 3 or 4, the lower housing 21 has a plate-like bottom portion 21a serving as the bottom of the lower housing 21. Further, the lower housing 21 has a front wall portion 23a standing upright on a front edge of the bottom portion 21a, and inner wall portions 23b standing upright on right and left edges of the bottom portion 21a, respectively. The lower housing 21 is formed projecting forward and laterally beyond the front wall portion 23a and the inner wall portions 23b. Therefore, the lower housing 21 has an outer bottom portion 22 spreading forward from an upper edge of the front wall portion 23a and spreading laterally from upper edges of the inner wall portions 23b. That is, the outer bottom portion 22 has a front bottom portion 22a spreading forward from the upper edge of the front wall portion 23a and located in the front portion of the lower housing 21. Further, the outer bottom portion 22 has right and left side bottom portions 22b spreading laterally from the upper edges of the inner wall portions 23b and located in right and left portions of the lower housing 21, respectively. In a use mode of the electronic apparatus 1, the bottom portion 21a faces a surface on which the electronic apparatus 1 is placed (hereinafter, referred to as installation surface), whereas the outer bottom portion 22 is spaced upward from the installation surface. Further, the lower housing 21 has outer wall portions 21c standing upright on the edges of the side bottom portions 22b, respectively. The side wall portions 26f of the upper housing 26 are arranged such that the lower edges of the side wall portions 26f are laid on the upper edges of the outer wall portions 21c.

The housing 2 has air vents 24 formed therein, which introduce the external air into the housing 2. In this example, the air vents 24 are formed in the front bottom portion 22a and the side bottom portions 22b, respectively. The air vents 24 are formed along the front wall portion 23a and the inner wall portions 23b standing upright on the edges of the bottom portion 21a. When a cooling fan 15 described below is driven, the air is introduced through the air vents 24. As described above, the lower housing 21 is formed projecting forward and laterally beyond the front wall portion 23a and the inner wall portions 23b.

As illustrated in FIG. 2, the electronic apparatus 1 includes the cooling unit 10 for cooling devices installed in the electronic apparatus 1, and the power circuit 17 for converting electric power supplied from the outside of the electronic apparatus 1 to electric power for driving each of the devices installed in the electronic apparatus 1. The cooling unit 10 and the power circuit 17 are arranged inside the housing 2. Further, the electronic apparatus 1 includes an optical disc drive 16 for reading storage medium inserted into the above-mentioned medium insertion slot 26d. In this example, the power circuit 17 is located in the rear portion of the housing 2, and the cooling unit 10 and the optical disc drive 16 are located in front of the power circuit 17. The cooling unit 10 and the optical disc drive 16 are arranged side by side.

As illustrated in FIG. 6 or 9, the cooling unit 10 includes a heat sink 13 and the cooling fan 15 for generating an air flow which receives heat of the heat sink 13. The cooling fan 15 and the heat sink 13 are disposed on a base plate 12, and the heat sink 13 is located outward, in a radial direction, of the cooling fan 15. In this example, the heat sink 13 is located posterior to the cooling fan 15. In this regard, an edge 13c of the heat sink 13 that is adjacent to the cooling fan 15 is curved to surround the cooling fan 15.

The cooling unit 10 is disposed above a circuit board (not shown). As illustrated in FIG. 9, the heat sink 13 is coupled with an integrated circuit 18 so that the heat of the integrated circuit 18 mounted on the circuit board is transmitted to the heat sink 13. In this example, a plurality of (two, in this example) plate-like heat-receiving blocks 12a are fixed onto a back surface (lower surface) of the base plate 12. The heat-receiving blocks 12a are held in contact with a front surface (upper surface) of the integrated circuit 18, and the heat of the integrated circuit 18 is transmitted to the base plate 12 via the heat-receiving blocks 12a. In this regard, a heat pipe 12b is also fixed onto the back surface of the base plate 12. The heat pipe 12b extends from the heat-receiving blocks 12a along the back surface of the base plate 12, and the heat received by the heat-receiving blocks 12a is transmitted to a wide area of the base plate 12 via the heat pipe 12b.

The heat sink 13 includes a plurality of fins 13a arranged parallel to the base plate 12, and a plurality of pillars 13b extending upward from the base plate 12. The heat of the base plate 12 is transmitted to the respective fins 13a via the pillars 13b.

As described above, the power circuit 17 is located in the rear of the cooling unit 10. In this example, the circuit board 17a of the power circuit 17 has a rectangular shape elongated in the right-left direction (X1-X2 direction) (see FIG. 7). The electronic components 17b, such as a condenser, a power transistor, and a transformer, are mounted on the front surface of the circuit board 17a (see FIG. 9). The power circuit 17 is housed in the power circuit case 4 formed separately from the housing 2.

The cooling unit 10 includes a heat sink cover 3 covering the heat sink 13 from above and guiding the air flow generated by driving of the cooling fan 15 (see FIG. 6). The power circuit case 4 is united with the heat sink cover 3. That is, the power circuit case 4 and the heat sink cover 3 are combined with each other such that one of a portion of the heat sink cover 3 through which the air flows out (opening 3a, in this example), and a portion of the power circuit case 4 through which the air flows in (cover 42e surrounding an air inlet 42a, in this example), receives the other. Further, the heat sink cover 3 and the power circuit case 4 constitute outer walls defining an air passage extending up to an air outlet 43a through which the air in the housing 2 is discharged to the outside.

Below, the power circuit case 4 housing the power circuit 17 and the cover covering the cooling unit 10 will be described in detail.

As illustrated in FIG. 6, a disc-like fan cover 14 is attached to the cooling fan 15, covering the cooling fan 15. A substantially circular air intake 14a is formed in the fan cover 14, and a plurality of fins 15a rotated by driving of the cooling fan 15 are exposed upward through the air intake 14a (see FIG. 5). By driving of the cooling fan 15, the air flows to the inside of the cooling unit 10 through the air intake 14a.

As described above, the cooling unit 10 includes the heat sink cover 3 covering the heat sink 13 from above and guiding the air flow generated by driving of the cooling fan 15. An opening 31a is formed in the heat sink cover 3. The opening 31a is located above the cooling fan 15, and the fan cover 14 is attached on an edge of the opening 31a. Specifically, the heat sink cover 3 includes a plurality of (two, in this example) attachment portions 31b located at the edge of the opening 31a. A plurality of attachment portions 14b are also formed at an outer peripheral edge of the fan cover 14, and the attachment portions 14b are fixed to the attachment portions 31b with screws.

The heat sink cover 3 includes a plate-like upper plate portion 31 located above the heat sink 13. As illustrated in FIG. 9, in a state in which the upper housing 26 covers the heat sink cover 3, the upper plate portion 31 is arranged along the upper plate portion 26a. As described above, the upper plate portion 26a is curved such that the center thereof in the front-rear direction swells upward. The upper plate portion 31 is curved in conformity with the upper plate portion 26a. Further, the fan cover 14 is located lower than the upper plate portion 31 of the heat sink cover 3, and is spaced from the upper plate portion 26a of the upper housing 26.

As illustrated in FIG. 5 or 6, the heat sink cover 3 includes a side wall portion 32 extending downward from the edge of the upper plate portion 31 and surrounding both the cooling fan 15 and the heat sink 13. The side wall portion 32 includes a first side wall portion 32a curved surrounding the cooling fan 15, and a second side wall portion 32b formed extending from the first side wall portion 32a in a circumferential direction of the cooling fan 15. The second side wall portion 32b is formed such that the distance between the second side wall portion 32b and the cooling fan 15 gradually increases as the second side wall portion 32b becomes further away from the first side wall portion 32a. Further, the side wall portion 32 includes a third side wall portion 32c extending rearward (toward the power circuit case 4) from the second side wall portion 32b and standing upright along the heat sink 13, and a fourth side wall portion 32d extending rearward (toward the power circuit case 4) from the first side wall portion 32a and standing upright along the heat sink 13.

The third side wall portion 32c and the fourth side wall portion 32d are formed to have an increasing distance therebetween as they extend rearward, that is, as they become closer to the power circuit case 4. In this example, the fourth side wall portion 32d is inclined such that the fourth side wall portion 32d becomes further away from the third side wall portion 32c as the fourth side wall portion 32d becomes closer to the power circuit case 4. In this regard, as illustrated in FIG. 6, a recess 32e provided for avoiding interference with the optical disc drive 16 adjacent to the cooling unit 10 is formed in the fourth side wall portion 32d.

By driving of the cooling fan 15, the air sucked through the air vents 24 of the housing 2 is introduced from the air intake 14a of the fan cover 14 into the heat sink cover 3. After that, the air flows in the radial direction owing to rotation of the fins 15a of the cooling fan 15. Then, the air is guided to the heat sink 13 by the heat sink cover 3. That is, the heat sink 13 is arranged on an air outlet side of the cooling fan 15. As illustrated in FIG. 6, the heat sink cover 3 opens toward the power circuit case 4, so that the air, which passes between the fins 13a of the heat sink 13, passes through the opening 3a located at the end portion of the heat sink cover 3 to flow into the power circuit case 4.

As described above, the power circuit 17 is housed in the power circuit case 4. In this example, the circuit board 17a of the power circuit 17 has a rectangular shape elongated in the right-left direction, and the power circuit case 4 has a substantially rectangular solid shape in conformity with a shape of the circuit board 17a. As illustrated in FIG. 7, the power circuit case 4 includes the upper wall member 40 covering the power circuit 17 from above, and a bottom wall member 45 covering the power circuit 17 from below.

The upper wall member 40 includes a substantially rectangular upper plate portion 41 located over the power circuit 17. The upper plate portion 41 is arranged on the back surface (lower surface) side of the upper plate portion 26a of the upper housing 26 and arranged along the upper plate portion 26a. In this example, the upper plate portion 26a is curved. Therefore, the upper plate portion 41 is inclined in conformity with the inclination of the upper plate portion 26a such that a rear edge of the upper plate portion 41 is lowered in position. Further, the upper wall member 40 has a box shape opening downward, and includes a front wall portion 42, a rear wall portion 43, and side wall portions 44 each extending downward from the edge of the upper plate portion 41 (see FIGS. 7 and 10).

The bottom wall member 45 includes a substantially rectangular plate-like bottom portion 45a arranged on the back surface (lower surface) side of the circuit board 17a, a front wall portion 46 standing upright on a front edge of the bottom portion 45a, and a rear wall portion 47 standing upright on a rear edge of the bottom portion 45a.

The upper wall member 40 is connected to the cooling unit 10 and forms the outer wall defining the air passage continuous with the cooling unit 10. In this example, the cooling unit 10 is provided with the heat sink cover 3. The upper wall member 40 is connected to the opening 3a of the heat sink cover 3 (see FIG. 10).

In detail, as illustrated in FIG. 8 or 10, the front wall portion 42 of the upper wall member 40 is arranged facing the heat sink 13. A grid-like air inlet 42a is formed in the front wall portion 42. The air inlet 42a is arranged facing a plane including the edge of the opening 3a and located close to the plane. As described below, the upper wall member 40 includes a cover 42e surrounding the air inlet 42a (see FIGS. 8 to 11). The cover 42e is formed extending toward the opening 3a and surrounding the opening 3a. Therefore, the cover 42e surrounds a space between the air inlet 42a and the opening 3a, whereby the air inlet 42a is connected to the opening 3a.

Further, the front wall portion 46 of the bottom wall member 45 is also arranged facing the heat sink 13. A grid-like air inlet 46a is also formed in the front wall portion 46 (see FIG. 7). The air inlet 46a is also arranged facing a plane including the edge of the opening 3a and located close to the plane. By arranging the air inlets 42a and 46a in this way, the air flowing out of the heat sink cover 3 passes through the air inlets 42a and 46a, and flows into the inside of the upper wall member 40 and the bottom wall member 45, that is, into the inside of the power circuit case 4.

The air inlets 42a and 46a are formed in conformity with a size of the opening 3a of the heat sink cover 3. That is, the air inlets 42a and 46a are located inside the opening 3a. In this example, as illustrated in FIG. 7 or 8, the air inlet 42a of the upper wall member 40 is only formed in a portion on one side (left side, in this example) in the right-left direction of the front wall portion 42. Similarly, the air inlet 46a of the bottom wall member 45 is only formed in a portion on one side (left side, in this example) in the right-left direction of the front wall portion 46.

As described above, the upper wall member 40 includes the cover 42e surrounding the opening 3a of the heat sink cover 3. As illustrated in FIGS. 8 to 11, the cover 42e includes an upper fin 42b and a pair of right and left side fins 42c and 42d. The opening 3a of the heat sink cover 3 is fitted to the inside of the upper fin 42b and the side fins 42c and 42d. In this example, the upper fin 42b is formed extending from the upper plate portion 41 and arranged along the upper plate portion 31 of the heat sink cover 3. The side fin 42c is arranged along the third side wall portion 32c of the heat sink cover 3, and the side fin 42d is arranged along the fourth side wall portion 32d. The upper fin 42b and the side fins 42c and 42d prevent the air in the heat sink cover 3 from flowing to the outside.

In this regard, as illustrated in FIG. 10, the front wall portion 46 of the bottom wall member 45 is disposed on the base plate 12. Sealing is effected between the base plate 12 and the lower surface of the bottom wall member 45. In detail, as illustrated in FIG. 6, a sealing member 19 extending along the edge of the base plate 12 is attached on the edge thereof. The sealing member 19 is sandwiched between the base plate 12 and the lower surface of the bottom wall member 45, thereby sealing between them.

As illustrated in FIG. 4, 7, or 10, an air outlet (corresponding to the air vent in claims) 43a facing the air inlet 42a is formed in the rear wall portion 43 of the upper wall member 40. The air outlet 43a is larger than the air inlet 42a formed in the front wall portion 42. In this example, the air outlet 43a is formed in the entire region of the rear wall portion 43, so that a width of the air outlet 43a is larger than a width of the air inlet 42a.

As illustrated in FIG. 7 or 11, an air outlet (corresponding to the second air vent in claims) 47a is also formed in the rear wall portion 47 of the bottom wall member 45. In this example, the air outlet 47a is only formed in part of the rear wall portion 47. Specifically, the air outlet 47a is only formed in a portion on one side (right side (on an X1 direction side), in this example) in the right-left direction of the rear wall portion 47. The air inlet 46a of the bottom wall member 45 is only formed in the portion on the left side (on an X2 direction side) of the front wall portion 46 as described above, so that the air outlet 47a is offset in position to the right with respect to the air inlet 46a. The air passage extending from the air inlet 46a to the air outlet 47a is located on the back surface side of the circuit board 17a of the power circuit 17. Since the air outlet 47a is offset in position to the right with respect to the air inlet 46a, it is possible to cool a wide area of the back surface of the circuit board 17a.

As illustrated in FIG. 10 or 11, the bottom wall member 45 and the upper wall member 40 are arranged facing each other in the up-and-down direction. The upper wall member 40 is fixed to the bottom wall member 45 such that the lower edge of the upper wall member 40 is laid on the upper edge of the bottom wall member 45. Further, the air flow entering from the air inlet 42a of the front wall portion 42 and the air inlet 46a of the front wall portion 46 passes the inside of the upper wall member 40 and the bottom wall member 45, and is then discharged from the air outlet 43a of the rear wall portion 43 and the air outlet 47a of the rear wall portion 47. That is, the air passage extending from the cooling unit 10 is surrounded from above, below, and both sides by the upper wall member 40 and the bottom wall member 45. The power circuit 17 arranged inside the upper wall member 40 and the bottom wall member 45 is located in the air passage defined by outer walls which the upper wall member 40 and the bottom wall member 45 forms. Therefore, the power circuit 17 is cooled by the air flowing in the air passage. In other words, the upper wall member 40 is fixed to the bottom wall member 45 such that the lower edge of the upper wall member 40 is laid on the upper edge of the bottom wall member 45, whereby the power circuit 17 is arranged in a space partitioned from the outside by the upper wall member 40 and the bottom wall member 45.

In this regard, the air passage extending from the cooling fan 15 to the air outlet 43a becomes gradually wider toward the air outlet 43a. In detail, as described above, the second side wall portion 32b of the heat sink cover 3 extends from the first side wall portion 32a in the circumferential direction of the cooling fan 15. This second side wall portion 32b is formed such that the distance between the second side wall portion 32b and the cooling fan 15 gradually increases as the second side wall portion 32b becomes further away from the first side wall portion 32a (becomes closer to the power circuit case 4). Further, the fourth side wall portion 32d of the heat sink cover 3 is inclined such that the fourth side wall portion 32d becomes further away from the third side wall portion 32c as the fourth side wall portion 32d becomes closer to the power circuit case 4. In addition, the upper wall member 40 has a width larger than a width (width in the right-left direction) of the heat sink cover 3, and the air outlet 43a is larger than the air inlet 42a. Accordingly, the air passage extending from the cooling fan 15 to the air outlet 43a becomes gradually wider toward the air outlet 43a.

The circuit board 17a of the power circuit 17 is supported spaced from the bottom portion 45a of the bottom wall member 45. In this example, as illustrated in FIG. 7, tubular fixing portions 45d protruding upward are formed on the bottom portion 45a of the bottom wall member 45. Screw holes are formed in the respective fixing portions 45d. Meanwhile, holes 17c are formed in the circuit board 17a at positions corresponding to the fixing portions 45d. The circuit board 17a is fixed to the fixing portions 45d with screws or bolts. The circuit board 17a is arranged on the fixing portions 45d in this way, so that the circuit board 17a is supported spaced from the bottom portion 45a of the bottom wall member 45. In this regard, besides the fixing portions 45d, plate-like small support portions 45c protruding upward are formed on the bottom portion 45a of the bottom wall member 45, and the support portions 45c also support the circuit board 17a.

As illustrated in FIG. 10 or 11, the air passage defined by the upper wall member 40 and the bottom wall member 45 includes a main passage F1 through which the air flow for cooling the power circuit 17 flows, and a bypass passage F2 partitioned from the main passage F1 by the circuit board 17a. In this example, the electronic components 17b having a large amount of heat generation are arranged on the front surface of the circuit board 17a. Therefore, the passage on the front surface side of the circuit board 17a, that is, the air passage defined by the circuit board 17a and the upper wall member 40, serves as the main passage F1 for cooling the power circuit 17. Further, the air passage on the back surface side of the circuit board 17a, that is, the air passage defined by the circuit board 17a and the bottom wall member 45, serves as the bypass passage F2.

In this regard, as illustrated in FIG. 7, 10, or 11, a deep bottom portion 45b which is deepest in the bottom portion 45a is formed in the bottom portion 45a of the bottom wall member 45. The deep bottom portion 45b ranges from the air inlet 46a toward the air outlet 47a. Therefore, the air entering from the air inlet 46a is allowed to flow smoothly up to the air outlet 47a.

As illustrated in FIG. 7, plate-like small attachment portions 40a, which face the bottom wall member 45 in the up-and-down direction, are formed at the lower edge of the upper wall member 40. Each of the attachment portions 40a has a hole formed therein. Meanwhile, the bottom wall member 45 has a plurality of tubular fixing portions 45e formed inside the edge thereof. Fasteners such as screws are fitted into the holes of the attachment portions 40a and the fixing portions 45e from above, whereby the upper wall member 40 is fixed to the bottom wall member 45. In this regard, a recess 41a is formed in the upper plate portion 41. A hole is also formed in the bottom of the recess 41a. The recess 41a is fixed to one of the fixing portions 45e with a screw or the like.

As illustrated in FIG. 4 or 12, the rear wall portion 43 having the air outlet 43a formed therein is exposed from the housing 2. In detail, an opening 2a having a shape corresponding to that of the rear wall portion 43 is formed in the housing 2, and the rear wall portion 43 is exposed through the opening 2a. In this example, the rear wall portion 43 of the upper wall member 40 is fitted in the opening 2a from the inside of the housing 2, and forms part of the outer surface of the electronic apparatus 1. Therefore, the air outlet 43a formed in the rear wall portion 43 also functions as an air outlet for discharging the air in the housing 2 to the outside of the housing 2. In other words, the air flowing inside the upper wall member 40 passes through the air outlet 43a, and is simultaneously ejected to the outside of the housing 2. In this way, the upper wall member 40 forms the outer wall defining the air passage which reaches the air outlet for ejecting the air from the housing 2.

In this example, the opening 2a formed in the housing 2 is defined by the upper housing 26 and the lower housing 21. The rear wall portion 43 is sandwiched by the upper housing 26 and the lower housing 21. In detail, the upper housing 26 includes a rear wall portion 28 extending downward from the rear edge of the upper plate portion 26a and forming the rear surface of the electronic apparatus 1. The lower edge of the rear wall portion 28 has a recess 28a formed therein and elongated in the right-left direction. Further, the lower housing 21 includes a rear wall portion 25 standing upright on the rear edge of the bottom portion 21a and forming the rear surface of the electronic apparatus 1. The upper edge of the rear wall portion 25 has a recess 25a formed therein and elongated in the right-left direction. The upper housing 26 and the lower housing 21 are combined with each other such that the recess 25a of the rear wall portion 25 and the recess 28a of the rear wall portion 28 face each other, whereby the opening 2a is defined. In this example, the rear wall portion 43 has a rectangular shape, and the opening 2a has a rectangular shape and a size corresponding to those of the rear wall portion 43.

As illustrated in FIG. 4 or 12, an air outlet 25b is formed in the rear wall portion 25 of the lower housing 21. The rear wall portion 47 of the bottom wall member 45 is located inside the housing 2 unlike the rear wall portion 43, and the air outlet 47a formed in the rear wall portion 47 faces the air outlet 25b.

As illustrated in FIG. 12, a plurality of louvers 43b for screening the inside of the power circuit case 4 from the outside thereof are provided on the air outlet 43a. In this example, each of the louvers 43b has a plate shape elongated in the right-left direction and bridges between right and left ends of the air outlet 43a (see FIG. 4). Further, the louvers 43b are inclined so as to screen the inside of the power circuit case 4 from the outside thereof. In this example, each of the louvers 43b is inclined such that a rear edge 43c of each of the louvers 43b is located lower than a front edge 43d thereof. The plurality of louvers 43b are aligned in the up-and-down direction. Two louvers 43b adjacent to each other in the up-and-down direction are arranged such that the two louvers 43b partially overlap each other in a back view of the electronic apparatus 1. That is, the front edge 43d of the upper louver 43b is positioned lower than the rear edge 43c of the lower louver 43b.

As described above, the upper plate portion 41 of the upper wall member 40 is inclined with the rear edge thereof descending in conformity with the upper plate portion 26a of the upper housing 26. An inclination angle of each louver 43b is larger than an inclination angle of the upper plate portion 41. That is, as illustrated in FIG. 12, an inclination angle $\theta 2$ of each louver 43b with respect to a horizontal plane is larger than an inclination angle $\theta 1$ of the upper plate portion 41 with respect to the horizontal plane. Since both the upper plate portion 41 and the louvers 43b are inclined, and besides the inclination angle of each louver 43b located at a downstream of the air passage with respect to the upper plate portion 41 is larger than the inclination angle of the upper plate portion 41, it is possible to increase an angle of an air discharge direction with respect to a horizontal direction while keeping the smooth air flow. In other words, when the upper plate portion 41 is horizontally arranged and the louvers 43b are largely inclined, an air flow direction is changed significantly depending on the louvers 43b. Meanwhile, as illustrated in FIG. 12, when both the upper plate portion 41 and the louvers 43b are inclined, the air in the upper space inside the power circuit case 4 also flows obliquely along the upper plate portion 41 before reaching the louvers 43b. Therefore, a change of the air flowing direction is reduced in the louvers 43b, and the smooth air flow can be maintained.

As illustrated in FIG. 12 or 4, a plurality of support portions 43e supporting the louvers 43b are formed between the louvers 43b. The plurality of support portions 43e arranged between two louvers 43b adjacent to each other in the up-and-down direction are aligned in the right-left direction at intervals. Further, the plurality of support portions 43e are also aligned in the up-and-down direction. Between the two louvers 43b adjacent to each other in the up-and-down direction, each of the support portions 43e is formed extending rearward along the louvers 43b. Therefore, the plurality of support portions 43e aligned in the up-and-down direction have a wall shape as a whole. As a result, when the electronic apparatus 1 is vertically installed, that is, when the electronic apparatus 1 is arranged such that the side wall portions 26f of the upper housing 26 and the outer wall portions 21c of the lower housing 21 face the installation surface, the support portions 43e prevent the inside of the power circuit case 4 from being seen from the outside. In this regard, an interval between two support portions 43e adjacent to each other is larger than an interval between the two louvers 43b adjacent to each other in the up-and-down direction. Therefore, an opening surrounded by the two support portions 43e adjacent to each other and the two louvers 43b adjacent to each other in the up-and-down direction is elongated in the right-left direction.

As described above, in the electronic apparatus 1, the air vent (air outlet in the above description) 43a is formed in the rear wall portion 43 of the power circuit case 4, and the opening 2a having a shape corresponding to that of the rear wall portion 43 of the power circuit case 4 is formed in the housing 2. Further, the rear wall portion 43 is exposed through the opening 2a of the housing 2. According to such electronic apparatus 1, it is possible to prevent an unnecessary space from being made inside the housing 2, and to improve ventilation efficiency of the air flowing through the power circuit 17. That is, when compared to the electronic apparatus in which air vents are respectively formed in both of the housing 2 and the power circuit case 4 and the air vents are arranged facing each other, it is possible to improve the ventilation efficiency.

Note that, the present invention is not limited to the above-mentioned electronic apparatus 1, and various modifications may be made.

For example, in the above description, the rear wall portion 43 of the power circuit case 4 is fitted in the opening 2a of the housing 2. However, the rear wall portion 43 may be arranged at the back of the opening 2a of the housing 2.

In the above description, the air vent 43a is formed in the entire region of the rear wall portion 43. However, the air vent 43a may be formed in only part of the rear wall portion 43. In this case, only the part having the air vent 43a formed therein may be exposed from the housing 2.

What is claimed is:

1. An electronic apparatus, comprising:
a power circuit;
a case housing the power circuit; and
a housing forming an outer surface of the electronic apparatus and housing the case, wherein:
the case includes a wall having an air vent formed therein, through which air flow for cooling the power circuit passes;
the housing has an opening formed therein, the opening having a shape corresponding to the wall of the case and opening in a first direction; and
the case is arranged such that the wall of the case is fitted in the opening of the housing,
the wall of the case includes, in the air vent, a plurality of louvers and a plurality of support portions, the plurality of louvers screening the inside of the case from the outside thereof and arranged in a second direction perpendicular to the first direction,
the plurality of support portions being aligned in the second direction to thereby form a wall to support the plurality of louvers.

2. The electronic apparatus according to claim 1, wherein the air vent of the case is formed in an entire region of the wall.

3. The electronic apparatus according to claim 1, wherein:
the housing includes a rear wall portion forming a rear surface of the electronic apparatus; and
the opening is formed in the rear wall portion.

4. The electronic apparatus according to claim 1, wherein:
the power circuit comprises a circuit board having a front surface on which an electronic component is mounted; and
the case includes an air passage on the front surface side of the circuit board and an air passage on a back surface side of the circuit board.

5. The electronic apparatus according to claim 4, wherein:
the air vent is formed so that the air flowing through the air passage on the front surface side of the circuit board passes through the air vent;
the case has a second air vent formed therein, through which the air flowing through the air passage on the back surface side of the circuit board passes;
the second air vent is located inside the housing; and the housing has an air vent formed therein, the air vent facing the second air vent.

6. An electronic apparatus, comprising:
a power circuit;
a case housing the power circuit; and
a housing forming an outer surface of the electronic apparatus and housing the case, wherein:
the case includes a wall having an air vent formed therein, through which air flow for cooling the power circuit passes;
the housing has an opening formed therein, a shape of the opening corresponding to the wall of the case;
the case is arranged such that the wall of the case is exposed through the opening of the housing;
the housing comprises a lower housing opening upward and an upper housing opening downward;
the upper housing is arranged such that a lower edge of the upper housing is laid on an upper edge of the lower housing;
at least one of the lower edge of the upper housing and the upper edge of the lower housing has a recess formed therein; and
the opening of the housing is defined by an edge of the recess and another one of the lower edge of the upper housing and the upper edge of the lower housing.

* * * * *